United States Patent
Tseng

(10) Patent No.: US 10,490,690 B1
(45) Date of Patent: Nov. 26, 2019

(54) VERTICAL CYLINDRICAL REACTION CHAMBER FOR MICRO LED EPITAXY AND LINEAR LUMINANT FABRICATION PROCESS

(71) Applicant: NEWGO DESIGN STUDIO, Taichung (TW)

(72) Inventor: Chun-Lin Tseng, Taichung (TW)

(73) Assignee: NEWGO DESIGN STUDIO, Taichung (TW)

(*) Notice: Subject to any disclaimer, the term of this patent is extended or adjusted under 35 U.S.C. 154(b) by 0 days.

(21) Appl. No.: 16/016,671

(22) Filed: Jun. 25, 2018

(51) Int. Cl.
| | |
|---|---|
| H01L 33/00 | (2010.01) |
| C30B 25/02 | (2006.01) |
| H01L 21/02 | (2006.01) |
| C30B 23/02 | (2006.01) |
| H01L 33/24 | (2010.01) |
| H01L 33/42 | (2010.01) |

(52) U.S. Cl.
CPC .......... *H01L 33/00* (2013.01); *C30B 23/025* (2013.01); *C30B 25/02* (2013.01); *H01L 21/0262* (2013.01); *H01L 33/0095* (2013.01); *H01L 33/24* (2013.01); *H01L 33/42* (2013.01); *H01L 2933/0016* (2013.01)

(58) Field of Classification Search
CPC .......... C30B 25/02–22; C30B 23/025; C23C 16/44–56; H01L 33/00–648; H01L 21/0262; H01L 33/0095; H01L 2933/0016
See application file for complete search history.

(56) References Cited

U.S. PATENT DOCUMENTS

| | | | | |
|---|---|---|---|---|
| 4,316,430 | A * | 2/1982 | Jolly | C23C 16/455 118/725 |
| 6,059,885 | A * | 5/2000 | Ohashi | C23C 16/4401 118/715 |
| 6,214,427 | B1 * | 4/2001 | Levinson | C30B 1/02 428/43 |
| 2004/0261716 | A1 * | 12/2004 | Hashizume | C23C 16/24 118/723 E |
| 2006/0169993 | A1 * | 8/2006 | Fan | H01L 27/153 257/88 |
| 2009/0108285 | A1 * | 4/2009 | Nakata | H01L 31/035281 257/103 |
| 2011/0163683 | A1 * | 7/2011 | Steele | F21V 23/02 315/192 |
| 2012/0003446 | A1 * | 1/2012 | Satoh | C30B 9/10 428/212 |
| 2018/0252378 | A1 * | 9/2018 | Sanchez | F21S 41/60 |
| 2019/0172972 | A1 * | 6/2019 | Herrmann | H01L 33/54 |

* cited by examiner

*Primary Examiner* — Eric A. Ward
(74) *Attorney, Agent, or Firm* — Leong C. Lei

(57) ABSTRACT

Provided is a method for fabrication of linear luminants with a vertical cylindrical reaction chamber for micro light emitting diode epitaxy, which is a method for forming light emission dices formed of micro light emitting diodes, in which a linear luminant is formed with a vertical cylindrical reaction chamber, in which operations of fabrication of the linear luminant including epitaxy, vapor deposition, etching are carried out so as to achieve the purpose that the linear epitaxial body can be cut and assembled even with an extremely small size and thus yield can be improved.

2 Claims, 9 Drawing Sheets

VERTICAL CYLINDRICAL REACTION CHAMBER FOR MICRO LED EPITAXY AND LINEAR LUMINANT FABRICATION PROCESS

(a) TECHNICAL FIELD OF THE INVENTION

The present invention relates generally to a vertical cylindrical reaction chamber for micro light emitting diode (LED) epitaxy and a method for fabrication of linear luminants, and more particularly to a micro LED using a linear body as a crystallization baseline and using a vertical cylindrical reaction chamber for carrying out spray coating, and a manufacturing method thereof.

(b) DESCRIPTION OF THE PRIOR ART

A known method for manufacturing an LED generally uses a circuit wafer substrate (A) as a starting point of fabrication. The progress of the epitaxy technology for fabrication of chips allows the size of dices (B). However, the reduced size makes it not possible to observe or conduct an assembly operation with bare eyes. How to cut and assemble the tiny dices has been long an issue to be overcome. In addition, the tiny dices (B) must be individually assembled, in a one by one manner, by using human labor or machines. Thus, the quality of soldering is generally inconsistent, leading to lowering of yield. This is a general drawback.

Further, referring to FIG. 2, which demonstrates a known process for manufacturing a regular LED (of which a description will be given by following the markings of arrow): a first step (C) of providing a substrate (C1) as a backing; a second step (D), in which the substrate (C1) with a first layer of epitaxy (n-type epi) (D1) and a second layer (P-type epi) (D2); a third step (E), in which the substrate (C1) is further coated, on the first layer of epitaxy (n-type epi) (D1) and the second layer (P-type epi) (D2), with a third layer of coating film (ITP) (E1) and the substrate (C1) is also coated, on a lower side surface thereof, with an N electrode layer (E2); a fourth step (F), in which the third layer of coating film (ITP) (E1) is coated with a photoresist layer (F1); a fifth step (G), in which an upper surface of the photoresist layer (F1) is covered, at two ends thereof, with shields (G1) so as to allow a middle portion thereof to be irradiated with UV light (G2) (exposure and development) to form a recessed groove (G3) in the middle portion; a sixth step (H), in which a metal vapor deposition layer (P electrode) (H1) is coated on interior of the recessed groove (G3) formed in the middle portion of the upper surface of the photoresist layer (F1) and the upper surface; a seventh step (I), in which etching is carried out with electrical shocks (I1); an eighth step (J), in which the wafer of epitaxy is subjected to partial cutting and supplying of electricity for testing, and a ninth step (K), in which the wafer of epitaxy is subject to complete cutting (for completely cutting off); a tenth step (L), in which inspection is made, and finally, an eleventh step (M) of packaging and warehousing.

Further, the know process of fabrication of light emitting diode dices generally involves 21 operations (of which the sequence may be varied according to difference of colors), this being the conventional metalorganic vapor deposition chamber based light emitting diodes (dices) fabrication process (of which a flow is illustrated in FIG. 3), comprising: (1) wafer washing, (2) epitaxy, (3) application of photoresist, (4) first mask, (5) dry etching, (6) metal vapor deposition, (7) second mask, (8) chemical etching (9) metal vapor deposition, (10) third mask, (11) chemical etching, (12) fourth mask, (13) metal vapor deposition, (14) chemical etching, (15) film deposition, (16) fifth mask, (17) chemical etching, (18) precision cutting, (19) dices selection, (20) packaging and warehousing, (21) assembling and sales. The number of dices used in a display is large and assembling or mounting the dice products in the display must be sequentially out as "dot", "line", and then "surface". The assembling or mounting of the dices, as carried out with machines, would be quite skilled and difficult after the size of the dices has been greatly reduced, and this would lead to lowering of yield.

Further, in the conventional metalorganic chemical vapor deposition (MOCVD) based fabrication process (as shown in a top plan view and a front side view given in FIG. 4 for carrying out the fabrication process), substrates (C1) carried by a wafer carrying tray is positioned in a reaction chamber (N), wherein the reaction chamber has an upper end that is provided with a gas inlet opening (N1) and the gas inlet opening (N1) is mounted with a gas nozzle (not shown); and left and right sides of the reaction chamber (N) are each provided with a gas outlet opening (N2). The reaction chamber (N) is provided, in an interior thereof, with a RF heater (O). As such, multiple wafer substrates (A) of the substrates (C) (GSAS) carried on wafer carrying tray are subjected, in the interior of the reaction chamber (N), epitaxy coating of multiple films with a gas sprayed through the gas inlet opening (N1) at the upper end of the reaction chamber (N). Such a process of epitaxial deposition implies that the multiple films are coated on the surface of the wafer only and would suffer all the drawbacks discussed above after being diced.

The wafer substrate (A) that is manufactured with the conventional way, after the epitaxy, is cut into tiny dices (B). Such tiny dices (B) has a huge quantity and transferring all such a huge quantity of dices and soldering the dices one by one would prove to be an extremely difficult process. The yield is surely subjected to great variation and the cost of fabrication would definitely increased.

SUMMARY OF THE INVENTION

Thus, in view of the problems of the prior art that the fabrication process is complicated and the defect rate is increased due to the excessively small size of the dices, the present invention aims to provide, through deep study and research of fabrication of light emitting diodes, a solution to overcome such drawbacks by providing a vertical cylindrical reaction chamber for micro light emitting diodes and a method for fabrication of linear luminants in order to overcome, once and for all, the issues of difficulty of assembling and poor yield caused by excessively small size of dices.

Based on the above, the present invention provides a linear metalorganic vapro deposition chamber and a process of fabrication of light emitting diodes (dice line), which comprises twelve (12) steps, including: (1) wafer washing, (2) primary epitaxy, (3) high temperature fusion, (4) secondary epitaxy, (5) high temperature fusion, (6) tertiary epitaxy, (7) electrically conductive film (ITO), (8) metal vapor deposition, (9) dry etching, (10) length cutting, (11) power-in test, and (12) packaging and warehousing.

With the above technical solution provided by the present invention, the following advantages can be obtained: (1) The reaction chamber is made as a vertical cylindrical reaction chamber and a basic material of linear bodies are arranged in the interior of the vertical cylindrical reaction chamber in a manner of being equally spaced and depending and being automatically heated, with a gas sprayed from a nozzle arranged at an upper end of the vertical cylindrical reaction chamber so as to carry out multiple operations of chamber based epitaxy. (2) With the fabrication of epitaxy carried out with the vertical cylindrical reaction chamber according to the present invention, a large quantity of epitaxial elements can be fabricated in one single batch. (3) With the linear body carrying dices thereon according to the present invention, the linear bodies can be used in a display by directly laying and arraying for use so that in the fabrication of the present invention, only etching is required, while partial cutting or complete cutting to for individual dices is not necessary. (4) With the linear body carrying dices thereon according to the present invention, all being combined together to provide a unitary structure, cutting and assembling can be carried out even for an extremely small size. (5) With the linear body carrying dices thereon according to the present invention, all being combined together to provide a unitary structure, the process is different from the prior art process where the dices are first cut and then assembled, while in this invention, after epitaxy, the dices are arranged and arrayed on the linear body to be ready for use. (6) With the linear body carrying dices thereon according to the present invention, the linear body can be formed in just one process, wherein the number of dices that can be formed in such process is much larger than that of the prior art so that the cost can be cut down further. (7) The linear body carrying dices thereon according to the present invention can be used as band-like LEDs or neon lights.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENTS

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
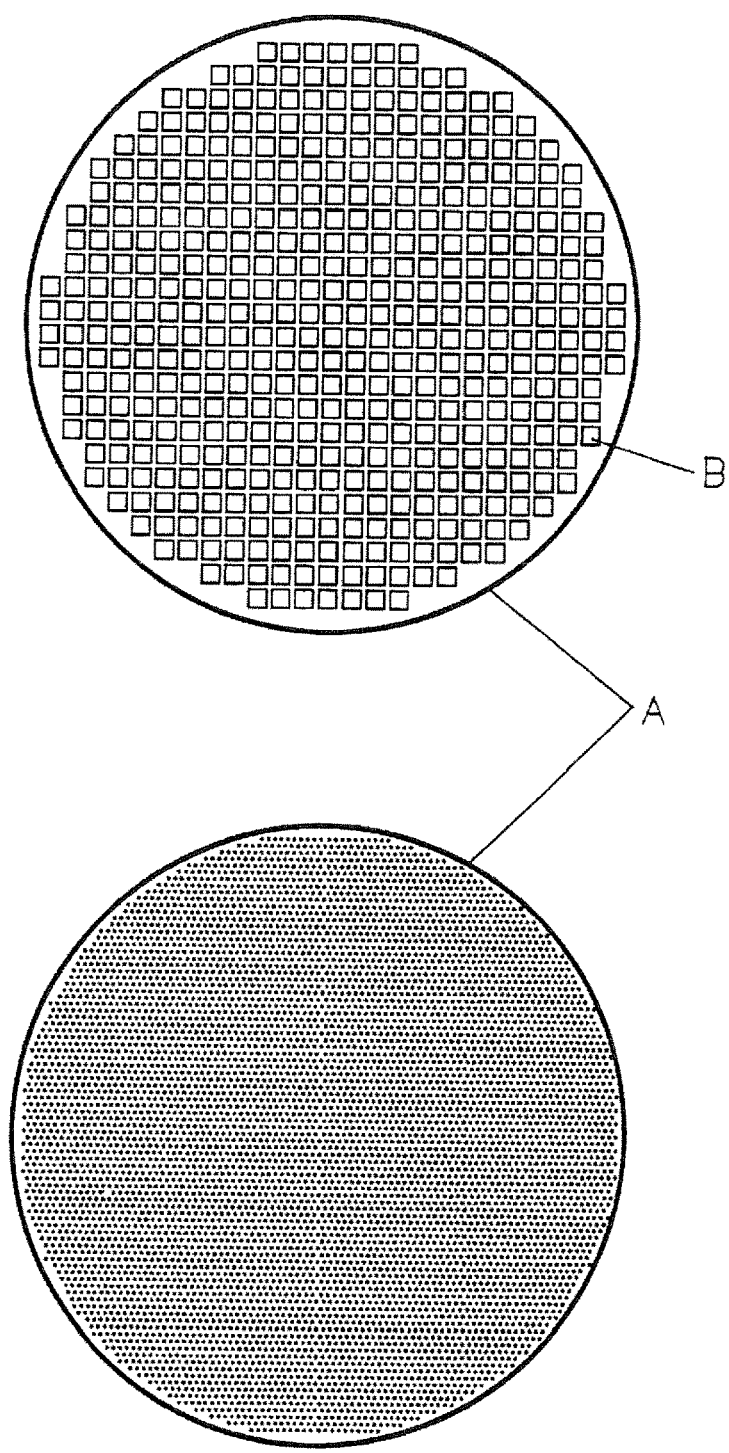
FIG. 1 is a schematic view illustrating a known method for making wafer.
Figure 2:
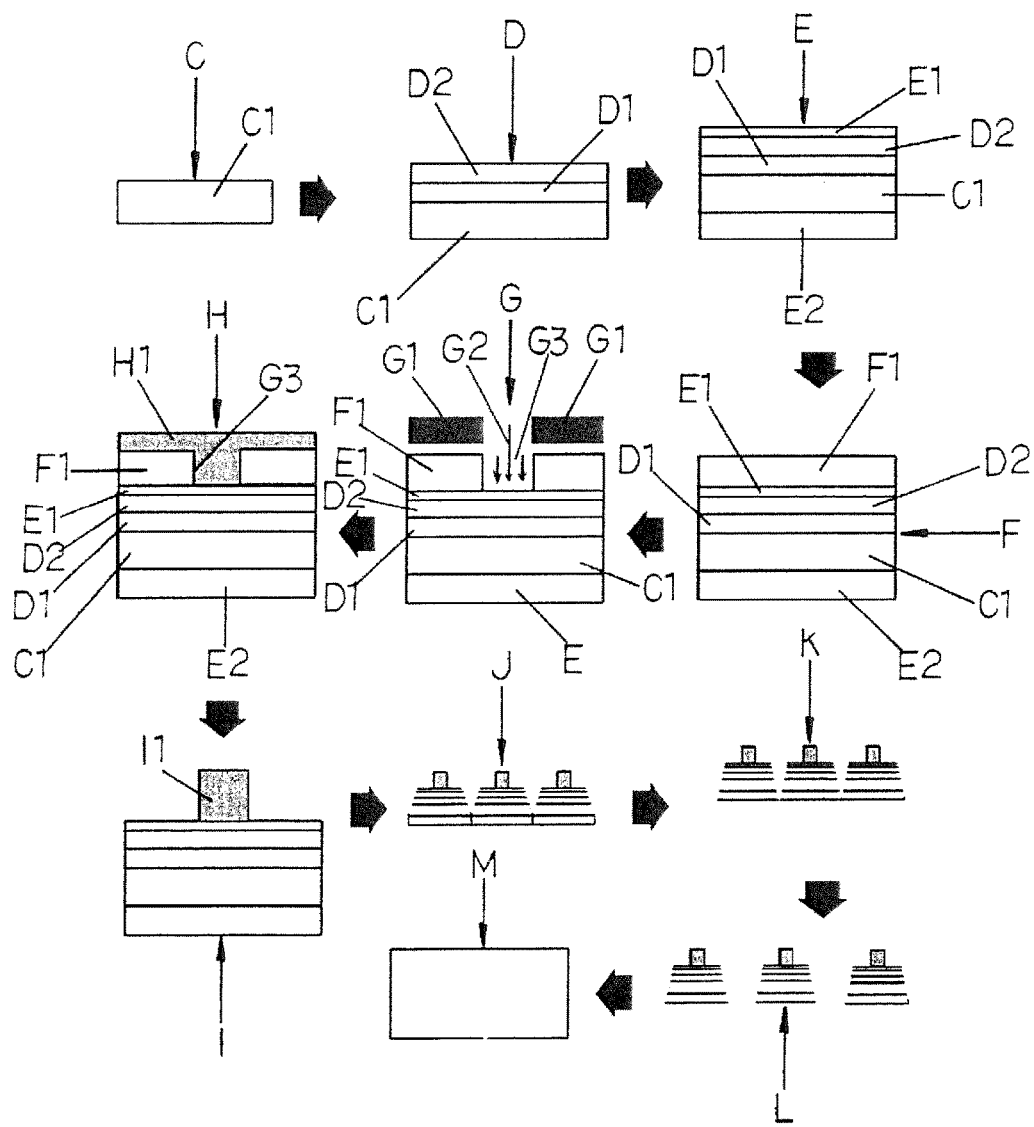
FIG. 2 is a flow chart of a known fabrication process for regular light emitting diodes.
Figure 3:
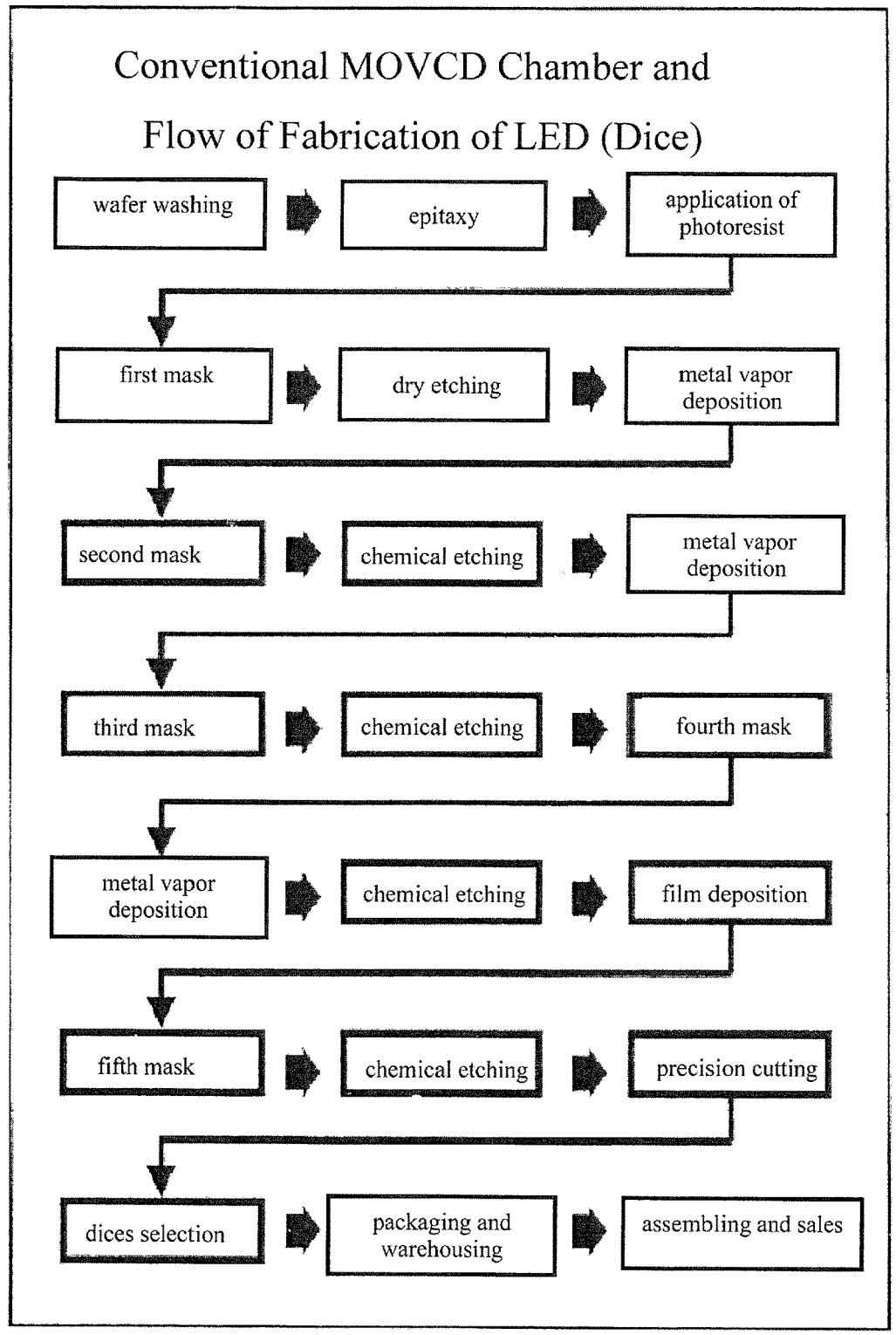
FIG. 3 is a block diagram for a known fabrication process for light emitting diodes (dices) with a known metalorganic vapor deposition chamber.
Figure 4:
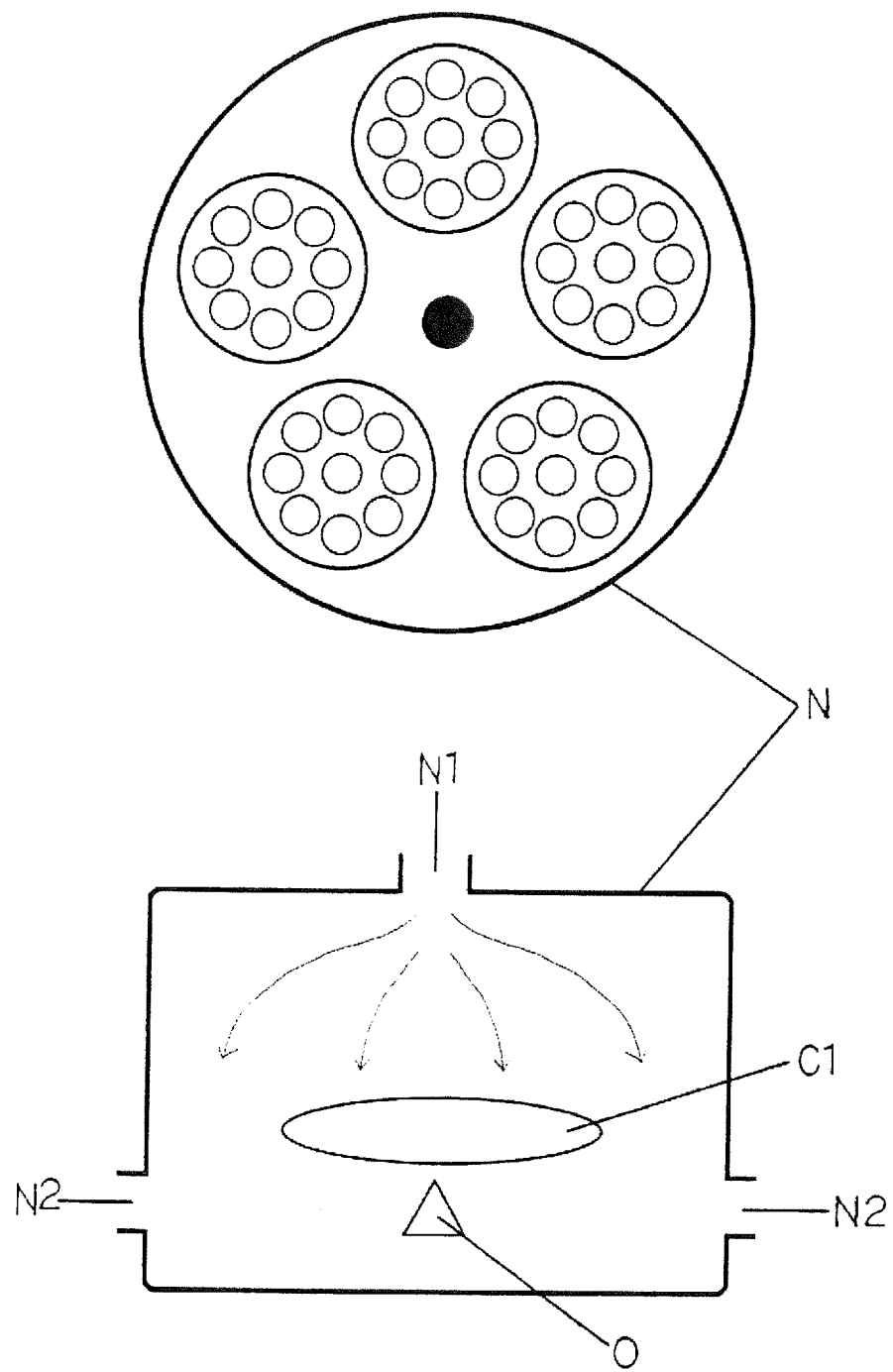
FIG. 4 shows a top view and a front side view of a conventional metalorganic chemical vapor deposition (MOCVD) chamber for carrying out the fabrication.
Figure 5:
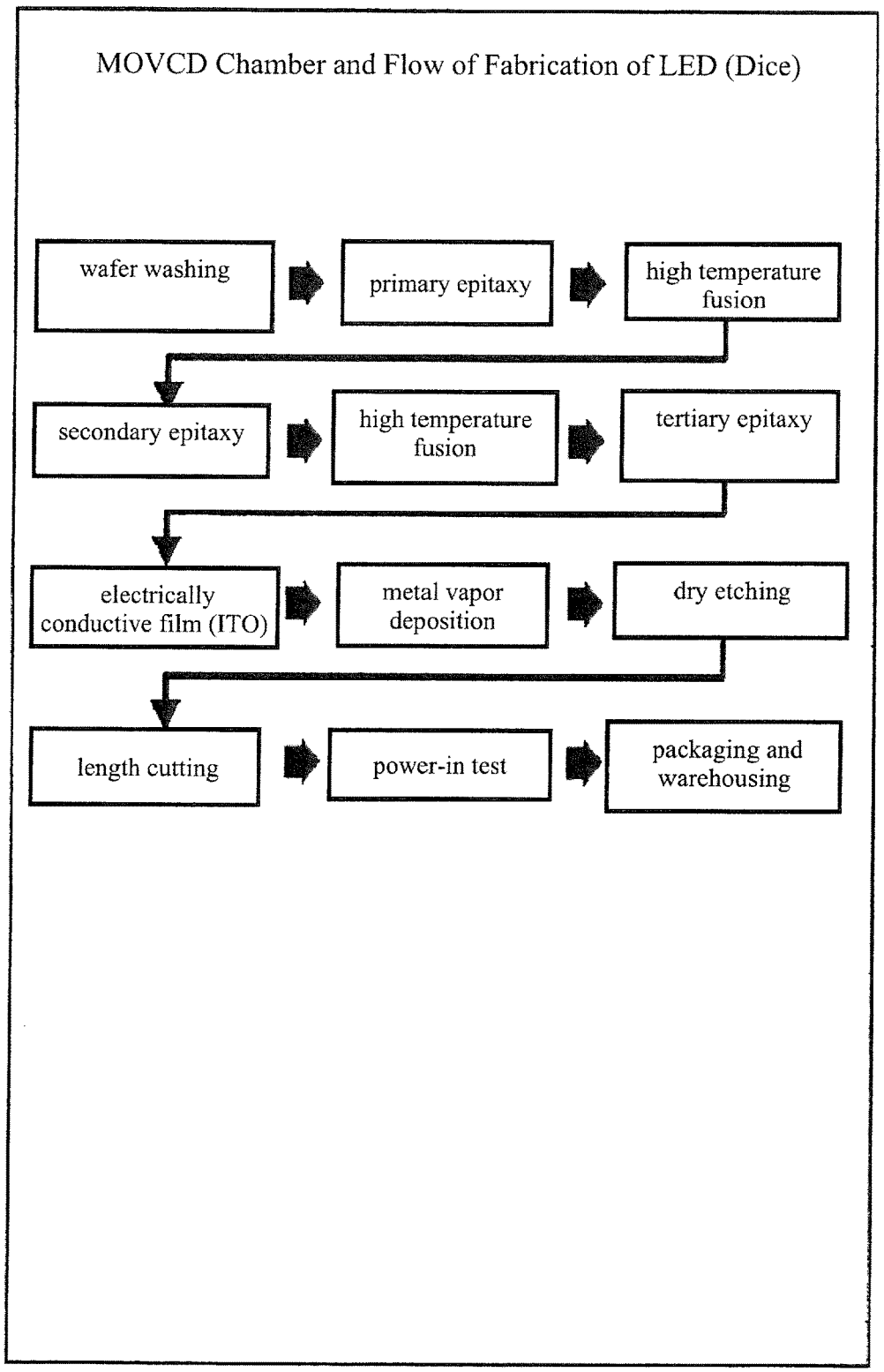
FIG. 5 is a block diagram of a linear metalorganic vapor deposition chamber based light emitting diode (dice line) fabrication process according to the present invention.

Referring to FIG. 5, a block diagram of a linear metalorganic vapor deposition chamber based light emitting diode (dice line) fabrication process according to the present invention is illustrated, generally comprising twelve (12) steps, including: (1) wafer washing, (2) primary epitaxy, (3) high temperature fusion, (4) secondary epitaxy, (5) high temperature fusion, (6) tertiary epitaxy, (7) electrically conductive film (ITO), (8) metal vapor deposition, (9) dry etching, (10) length cutting, (11) power-in test, and (12) packaging and warehousing.

Figure 6:
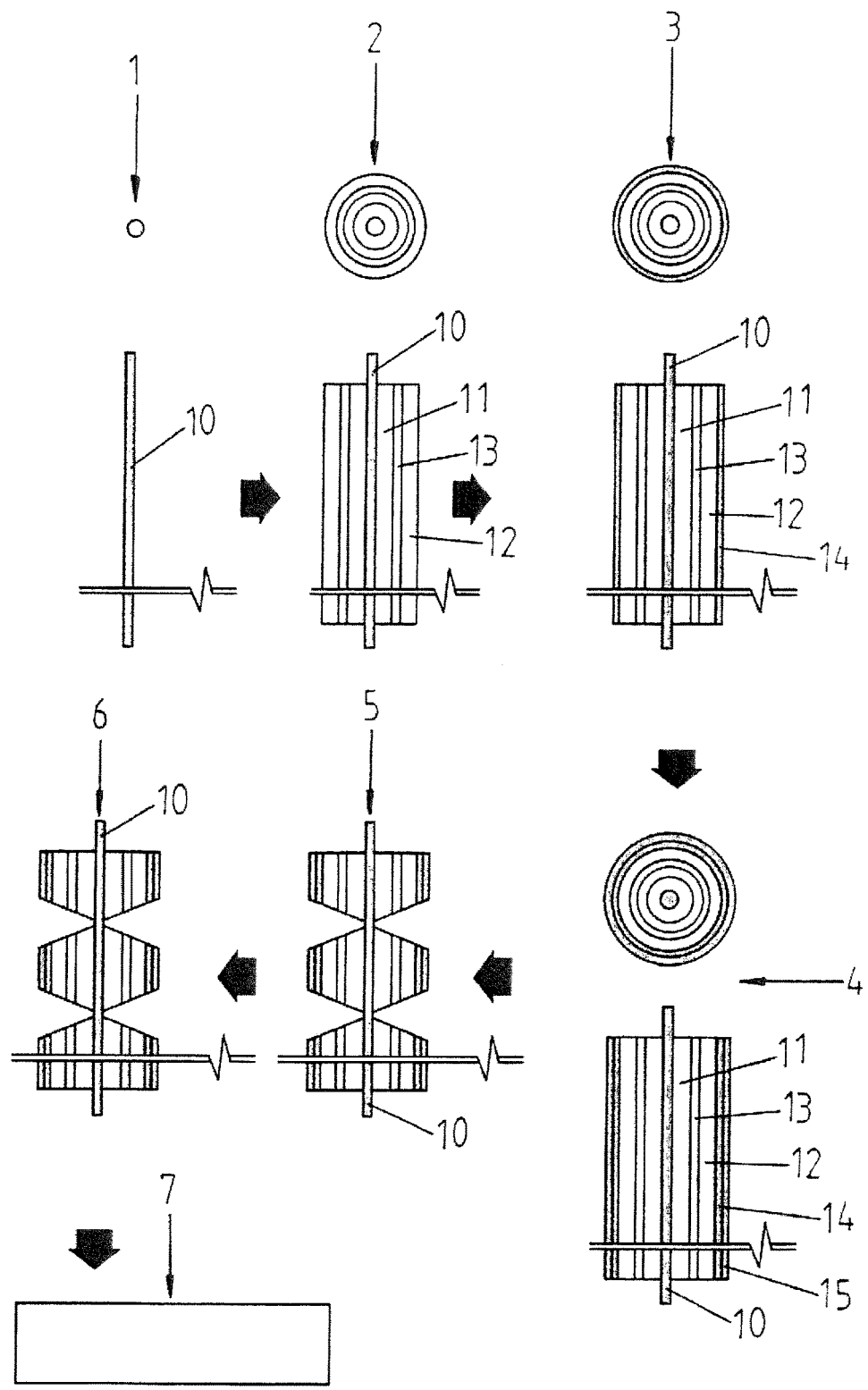
FIG. 6 is a schematic view showing a flow chart of a process of fabrication of micro light emitting diodes through linear metalorganic vapor deposition according to the present invention.
Figure 7:
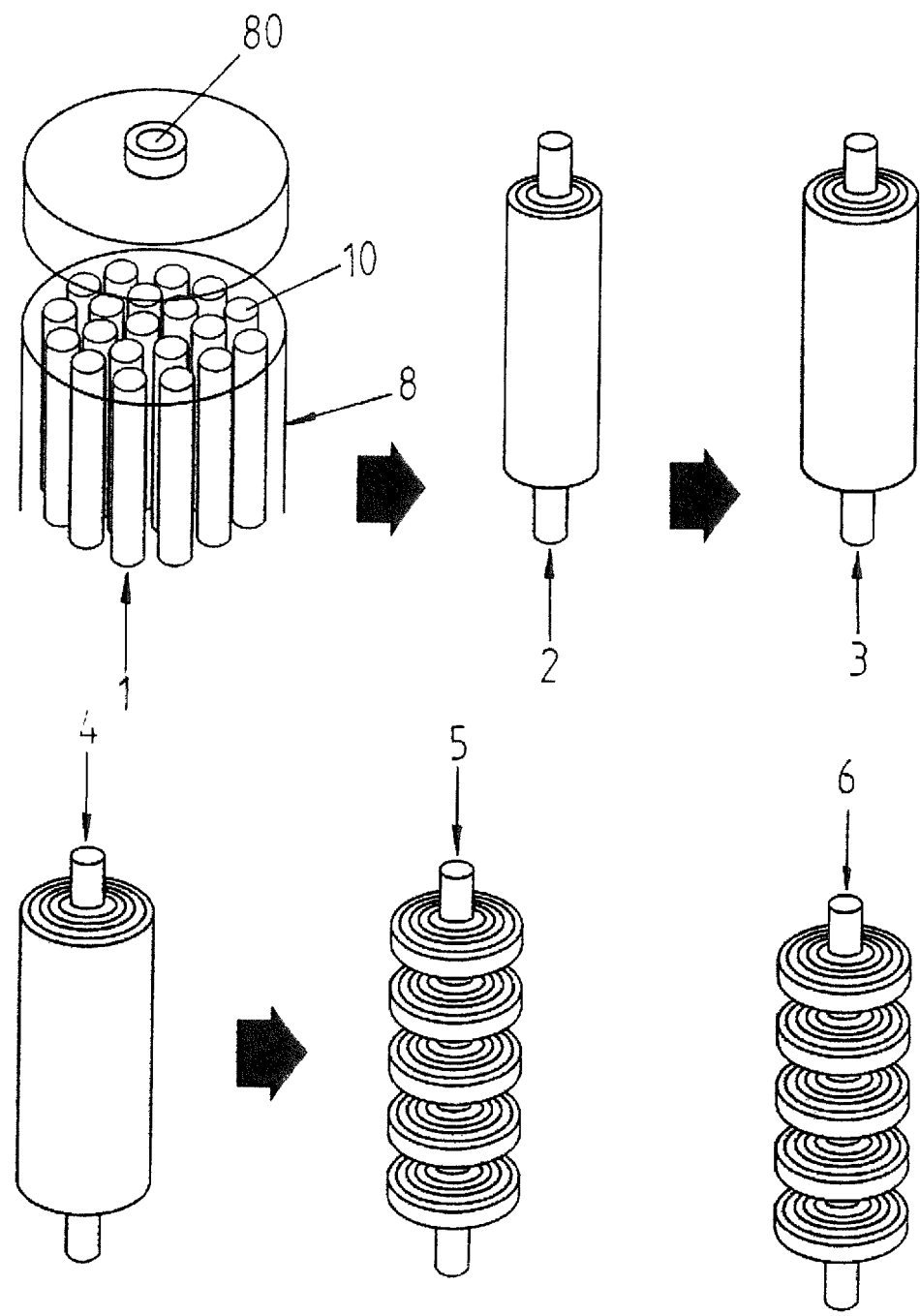
FIG. 7 is a schematic view showing the flow chart of FIG. 5.

Further referring to FIGS. 6 and 7, a schematic view showing a flow chart of a process of fabrication of micro light emitting diodes according to the present invention, and a perspective view showing the process of fabrication are shown, respectively, wherein the process (description being made according to markings of arrow) includes: a first step (1), which is crystallization baselines (linear conductive material-P electrode heating) (10) are formed; a second step (2), in which multiple epitaxial layers are formed to surround an outer circumference of the crystallization baselines (10) in a vertical cylindrical reaction chamber (7), namely a first layer that is an N semiconductor layer (N-type epi) (11) and a second layer that is a P semiconductor layer (P-type epi) (12), and an energy gap between the first layer that is an N semiconductor layer (N-type epi) (11) and the second layer that is a P semiconductor layer (P-type epi) (12) is a light emission layer (13); a third step (3), in which an electrically conductive film (ITO) (14) is further coated on an outer circumference of the second layer that is a P semiconductor layer (P-type epi) (12); a fourth step (4), in which a metallic coating film (N electrode) (15) is further coated on the electrically conductive film (ITO) (14); a fifth step (5), in which etching is performed on the epitaxy linear body (100); a sixth step (6), in which conducting is made between the crystallization baseline (P electrode) (10) and the metallic coating film (N electrode) (15) for tests through supply of electricity; and a seventh step (6), in which final packaging and warehousing are carried out.

Figure 8:
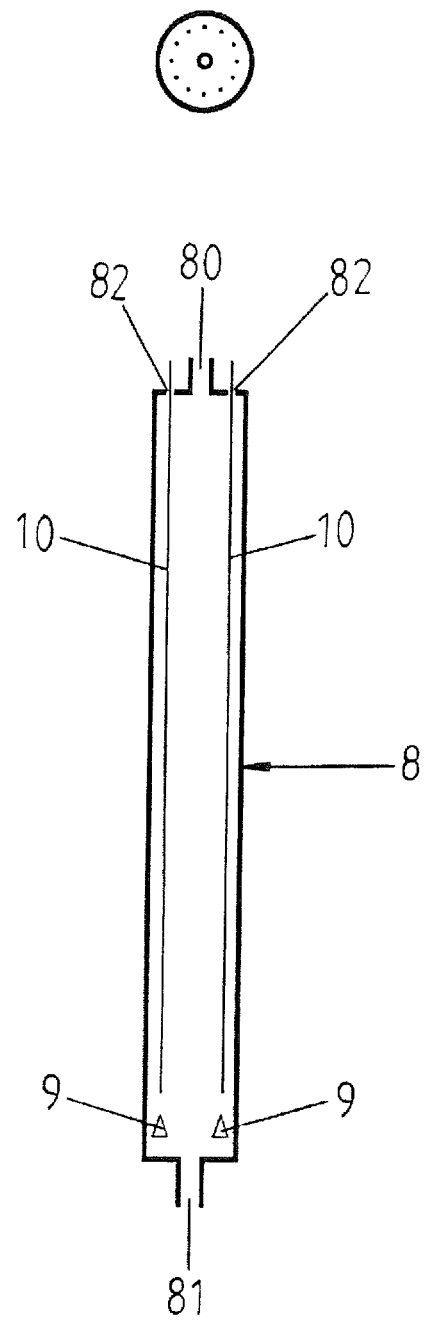
FIG. 8 shows a top view of a linear organic metal vapor deposition reaction chamber for implementation of the fabrication process according to the present invention and a plan schematic view observed from the front side.

The crystallization baseline (10) described above is a P electrode, while the outermost layer is a metallic coating film (N electrode) (15). Further referring to FIG. 8, which shows a top view of a linear organic metal vapor deposition reaction chamber for implementation of the fabrication process and a plan schematic view observed from the front side, a reaction chamber is made as a vertical cylindrical reaction chamber (8), which has two (upper and lower) ends that are respectively formed as a gas inlet opening (80) and a gas outlet opening (81), and the chamber is provided, in an interior thereof at a location close to or adjacent to the lower end, with a heater (9) for direct heat conducting and self heating of the crystallization baselines (10) arranged in the vertical cylindrical reaction chamber (8). A gas nozzle (not shown) is provided at the gas inlet opening (80) on the upper end and multiple arrayed through holes (82) are formed in an end surface of a circumference of the gas inlet opening (80). The multiple arrayed through holes (82) are provided for receiving vertically downward penetration of crystallization baselines (10) to depend therefrom.

The upper end surface of the above-described vertical cylindrical reaction chamber (8) receives, and also fixes, the multiple crystallization baselines (10) to vertically downward penetrate therethrough and thus depending therefrom (of which the description will be given with reference to FIG. 7) so that a gas formed of chemical elements and organic radicals to be combined is sprayed through the gas nozzle (not shown) provided at the gas inlet opening (70) of the vertical cylindrical reaction chamber (7) to have the crystallization baselines (10) to be attached with a film of a desired material, namely the operations of reaction chamber epitaxy, vapor deposition (ITO), vapor deposition (N electrode), and etching, to complete the epitaxy process.

After the above-described epitaxy, the epitaxy linear body (100) is etched to form a linear body carrying multiple dices (101), and each of the dices (101) is such that the crystallization baseline (linear conductive material-P electrode heating) (10) at the center to serve as a base, which is coated, externally thereof, with the first layer of N semiconductor layer (N-type epi) (11) and the second layer of P semiconductor layer (P-type epi) (12), wherein the first layer that is an N semiconductor layer (N-type epi) (11) and the second layer that is a P semiconductor layer (P-type epi) (12) are provided therebetween with a light emission layer (13), and then, the electrically conductive film (ITO) (14) and the metallic coating film (N electrode) (15), so as to provide a structure comprising multiple dices (101) on the epitaxy linear body (100).

Figure 9:
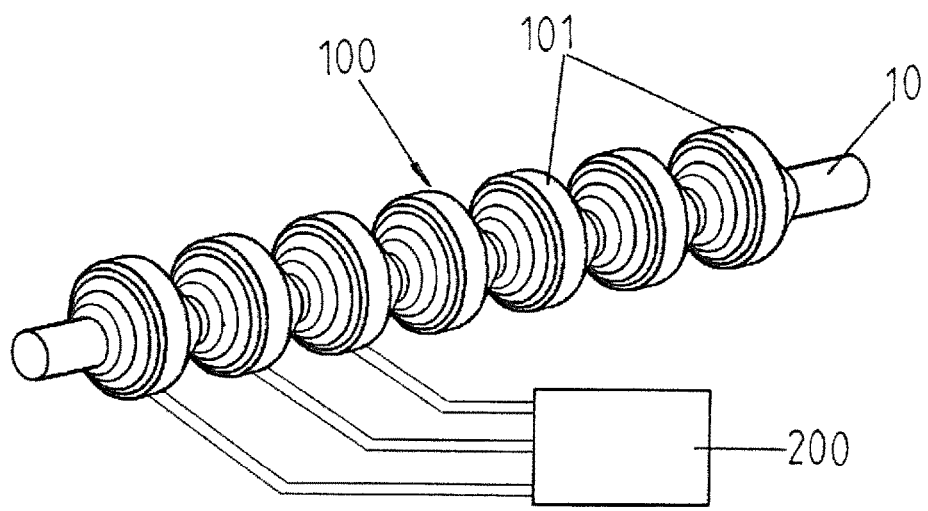
FIG. 9 is a schematic view illustrating testing of the linear crystalline line according to the present invention by supplying electricity thereto.

Finally, the epitaxy linear body (100) is tested by supply of electricity with a drive IC (200) (see FIG. 9) to complete the final step of testing of the epitaxy linear body (100).

Figure 10:
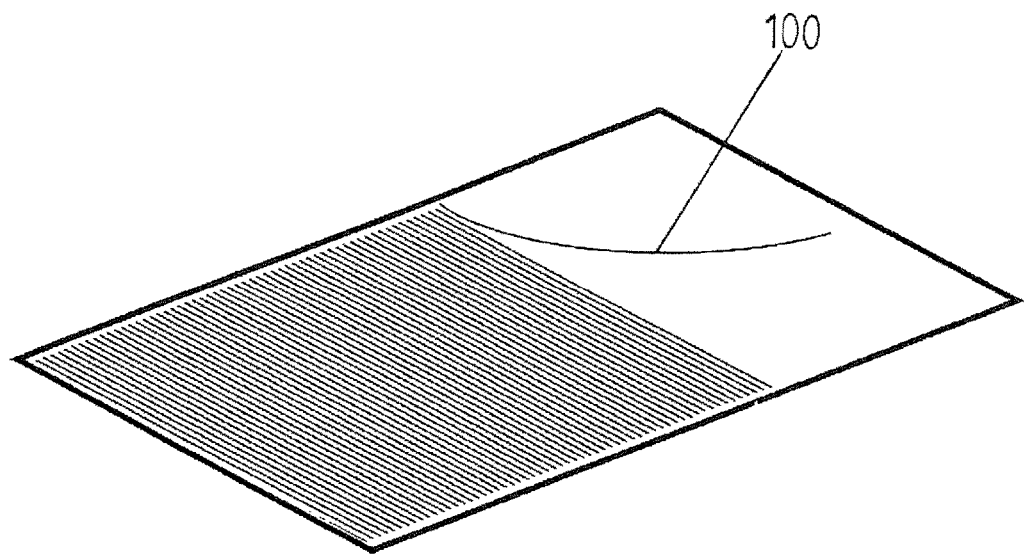
FIG. 10 is a schematic view, illustrating, in a three-dimensional way, an example of installation of the products of the linear crystalline lines.

Further, referring to FIG. 10, a schematic view is provided to illustrate, in a three-dimensional way, an example of installation of the products of the linear crystalline lines, wherein linear bodies that are each formed with the epitaxy linear body (100) subjected to epitaxy and multiple operations of test and inspection are laid, in sequence, to form a curtain-like LED display.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the claims of the present invention.

I claim:

1. A method for fabrication of an epitaxial line of light emitting dices of micro light-emitting diodes, comprising forming crystallization linear bodies with a conductive material, providing a reaction chamber having a structure of vertical cylindrical reaction chamber, arranging multiple ones of the crystallization linear bodies in the vertical cylindrical reaction chamber in a vertically downward depending manner, providing a heater in the vertical cylindrical reaction chamber to be adjacent to a lower end of the chamber for heating of the crystallization linear bodies with a gas sprayed from an upper end of the chamber to carry out epitaxy of multiple layers to form linear epitaxial luminants that include multiple light emitting dices that are operable to emit light in a circumferential space of a full circle of 360 degrees and allow for cutting and assembling, wherein forming the linear epitaxial luminants that include multiple light emitting discs of each of the crystallization linear bodies is carried out with an etching operation that is carried out to etch the light emitting discs to be vertically separated from each other while connected to the crystallization linear body, such that two adjacent ones of the multiple light emitting discs have surfaces facing each other and spaced from each other.

2. The method according to claim 1, wherein the linear epitaxial luminants are usable as band-like LEDs or neon lights.

* * * * *